United States Patent
Lee et al.

(10) Patent No.: US 11,664,411 B2
(45) Date of Patent: *May 30, 2023

(54) SEMICONDUCTOR STRUCTURE HAVING INTEGRATED INDUCTOR THEREIN

(71) Applicant: TAIWAN SEMICONDUCTOR MANUFACTURING COMPANY LTD., Hsinchu (TW)

(72) Inventors: Ming-Che Lee, Tainan (TW); Sheng-Chau Chen, Tainan (TW); I-Nan Chen, Taipei (TW); Cheng-Hsien Chou, Tainan (TW); Cheng-Yuan Tsai, Hsin-Chu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/238,041

(22) Filed: Apr. 22, 2021

(65) Prior Publication Data

US 2021/0242303 A1 Aug. 5, 2021

Related U.S. Application Data

(63) Continuation of application No. 16/744,793, filed on Jan. 16, 2020, now Pat. No. 11,011,600, which is a continuation of application No. 16/205,065, filed on Nov. 29, 2018, now Pat. No. 10,541,297, which is a continuation of application No. 15/707,240, filed on Sep. 18, 2017, now Pat. No. 10,164,001.

(51) Int. Cl.
| | |
|---|---|
| H01L 49/02 | (2006.01) |
| H01L 23/31 | (2006.01) |
| H01L 27/01 | (2006.01) |
| H01L 23/00 | (2006.01) |
| H01L 23/522 | (2006.01) |

(52) U.S. Cl.
CPC .......... H01L 28/10 (2013.01); H01L 23/3171 (2013.01); H01L 23/5227 (2013.01); H01L 24/05 (2013.01); H01L 27/01 (2013.01); *H01L 2224/11* (2013.01)

(58) Field of Classification Search
None
See application file for complete search history.

(56) References Cited

U.S. PATENT DOCUMENTS 9,799,721 B2 * 10/2017 Kuo .................. H01L 23/645
11,011,600 B2 * 5/2021 Lee .................... H01L 27/01
(Continued)

*Primary Examiner* — Hsien Ming Lee

(74) *Attorney, Agent, or Firm* — WPAT Law; Anthony King

(57) ABSTRACT

A semiconductor structure includes: a substrate; a first passivation layer over the substrate; a second passivation layer over the first passivation layer; and a magnetic core in the second passivation layer, wherein the magnetic core includes a first magnetic material layer and a second magnetic material layer over the first magnetic material layer, the first magnetic material layer and the second magnetic material layer are separated by a high resistance isolation layer, and the high resistance isolation layer has a resistivity greater than about 1.3 ohm-cm.

20 Claims, 18 Drawing Sheets

(56) References Cited

U.S. PATENT DOCUMENTS

2006/0257677 A1\* 11/2006 Choi ................ H01L 27/08
  428/493
2015/0340422 A1\* 11/2015 Lee ................ H01L 24/80
  438/3
2016/0155935 A1\* 6/2016 Eissa ................ C23F 1/28
  252/79.4

\* cited by examiner

SEMICONDUCTOR STRUCTURE HAVING INTEGRATED INDUCTOR THEREIN

CROSS REFERENCE TO RELATED APPLICATIONS

This application is a continuation of application Ser. No. 16/744,793, filed on Jan. 16, 2020, which is a continuation of application Ser. No. 16/205,065, filed on Nov. 29, 2018, which is a continuation of application Ser. No. 15/707,240, filed on Sep. 18, 2017. All of the above-referenced applications are hereby incorporated herein by reference in their entirety.

BACKGROUND

Generally, an inductor is a passive electrical component that can store energy in a magnetic field created by an electric current passing through it. An inductor may be constructed as a coil of conductive material wrapped around a core of dielectric or magnetic material. One parameter of an inductor that may be measured is the inductor's ability to store magnetic energy, also known as the inductor's inductance. Another parameter that may be measured is the inductor's Quality (Q) factor. The Q factor of an inductor is a measure of the inductor's efficiency and may be calculated as the ratio of the inductor's inductive reactance to the inductor's resistance at a given frequency.

Traditionally, inductors are used as discrete components which are placed on a substrate such as a printed circuit board (PCB) and connected to other parts of the system, such as an integrated circuit (IC) chip, via contact pads and conductive traces. Discrete inductors are bulky, require larger footprints on the PCB, and consume lots of power. Due to the continued miniaturization of electric devices, it is desirable to integrate inductors into IC chips. Therefore, there is a need for manufacturing integrated inductors that provide the benefit of size, cost and power reduction without sacrificing the electrical performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. Specifically, dimensions of the various features may be arbitrarily increased or reduced for clarity of discussion.

DETAILED DESCRIPTION

Figure 1:
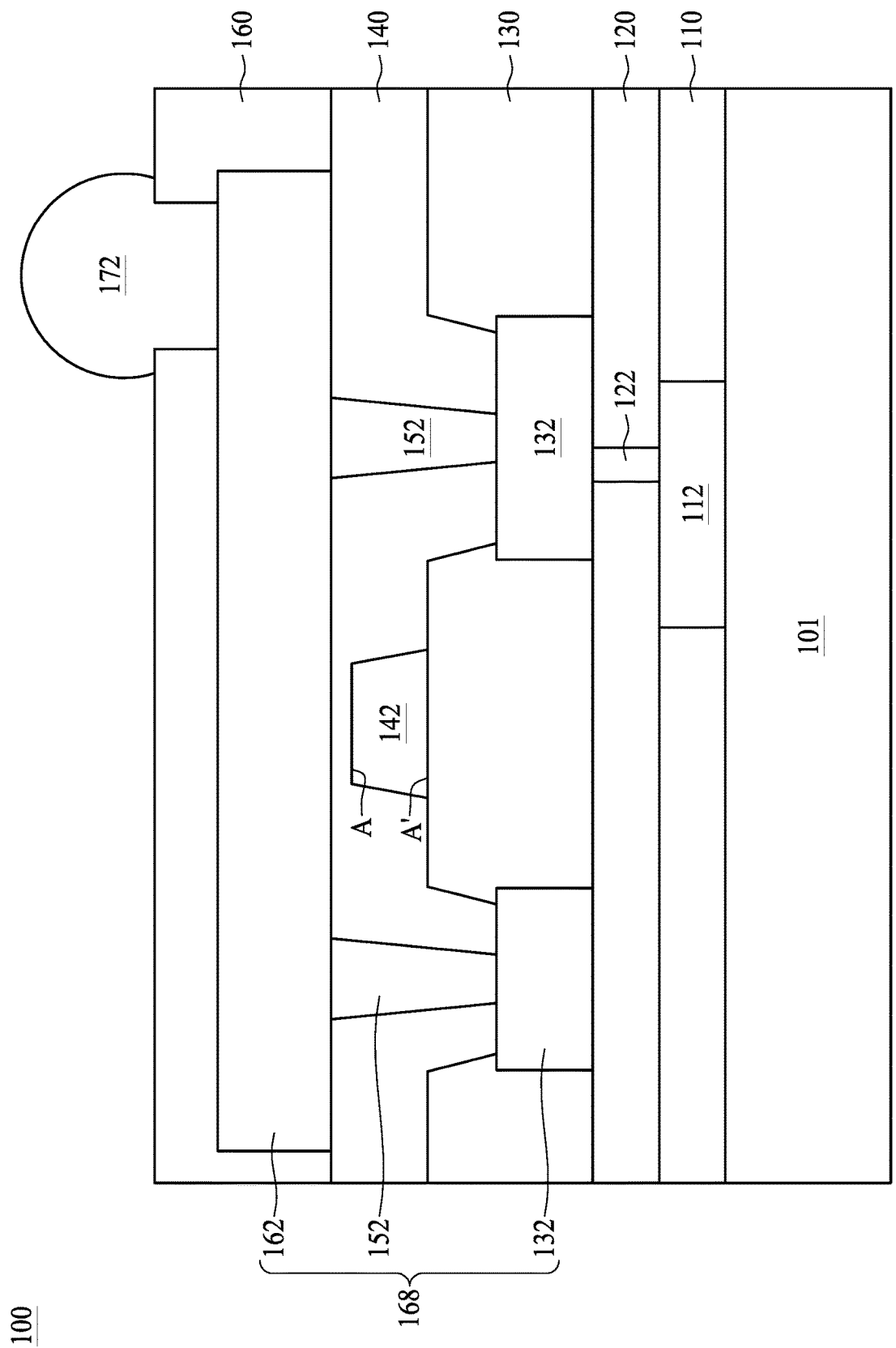
FIG. 1 illustrates a cross-sectional view of a semiconductor device having an integrated inductor formed in passivation layers during the Back-End-Of-Line (BEOL) processing of semiconductor manufacturing process in accordance with an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals or letters in the various examples. This repetition is for the purpose of simplicity and clarity and does not in itself dictate a relationship between the various embodiments and configurations discussed.

Further, spatially relative terms, such as "beneath," "below," "lower," "above," "upper" and the like, may be used herein for ease of description to describe one element or feature's relationship to another element or feature as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating or working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

The embodiments will be described with respect to embodiments in a specific context, namely an integrated inductor with a magnetic core. The embodiments may also be applied, however, to other integrated components.

FIG. 1 illustrates a cross-sectional view of a semiconductor device 100 having an integrated inductor formed in passivation layers during the Back-End-Of-Line (BEOL) processing of semiconductor manufacturing process in accordance with various embodiments of the present disclosure. As shown in FIG. 1, an integrated inductor 168 includes a plurality of coils or windings that are concatenated and formed around a magnetic core 142. The magnetic core 142 has an upper surface A and a lower surface A'. The surfaces A and A' are parallel to a substrate 101. Each of the plurality of coils may include an upper portion 162 (hereafter upper coil segment 162) and a lower portion 132 (hereafter lower coil segment 132). In some embodiments, the lower coil segment 132 is formed in a passivation layer 130 below the magnetic core 142, and the upper coil segment 162 is formed in another passivation layer 160 above the magnetic core 142, and vias 152 connect the upper coil segment 162 with the lower coil segment 132.

The integrated inductor 168 may connect to conductive traces and conductive pads, which may further connect to other conductive features of the semiconductor device 100 to perform specific functions. Although not shown in FIG. 1, the integrated inductor may be connected through, e.g., vias to other conductive features formed in various layers of the semiconductor device 100, in some embodiments.

The integrated inductor 168, which includes the lower coil segment 132, the vias 152, the upper coil segment 162 and the magnetic core 142, is formed in a plurality of passivation layers over semiconductor substrate 101. Note that depending on the specific design for the upper coil segment 162 and the lower coil segment 132, the upper coil segment 162 or the lower coil segment 132 may not be visible in a cross-sectional view, in some embodiments. In other embodiments, at least a portion of the upper coil segment 162 or/and at least a portion of the lower coil segment 132 may not be visible in a cross-sectional view. To simplify illustration, both the upper coils segments 162 and the lower coil segment 132 are shown as visible in all cross-sectional views in the present disclosure without intent to limit. One of ordinary skill in the art will appreciate that the embodiments illustrated in the present disclosure can be easily applied to various designs for the upper coils segments 162 and the lower coil segment 132 without departing from the spirit and scope of the present disclosure.

The semiconductor substrate 101 may include bulk silicon, doped or undoped, or an active layer of a silicon-on-insulator (SOI) substrate. Generally, an SOI substrate includes a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The semiconductor substrate 101 may include active devices (not shown in FIG. 1 for conciseness). As one of ordinary skill in the art will recognize, a wide variety of active devices such as transistors, capacitors, resistors, combinations of these, and the like may be used to generate the desired structural and functional requirements of the design for the semiconductor device 100. The active devices may be formed using any suitable methods.

The semiconductor substrate 101 may also include metallization layers (also not shown in FIG. 1 for conciseness). The metallization layers may be formed over the active devices and are designed to connect the various active devices to form functional circuitry. The metallization layers (not shown) may be formed of alternating layers of dielectric (e.g., low-k dielectric material) and conductive material (e.g., copper) and may be formed through any suitable process (such as deposition, damascene, dual damascene, etc.).

As illustrated in FIG. 1, passivation layers (e.g., a first passivation layer 110, a second passivation layer 120, the third passivation layer 130, a fourth passivation layer 140 and the fifth passivation layer 160) are formed consecutively over the substrate 101, in some embodiments. The first passivation layer 110 may be disposed over the substrate 101, and post-passivation interconnect (PPI) 112 may be formed in the first passivation layer 110. The PPI may be connected to metal layers in the substrate 101 or other layers of the semiconductor device 100 by vias (not shown), in some embodiments. The PPI may be connected to the lower coil segment 132 formed in the third passivation layer 130 by the vias 122, which are formed in the second passivation layer 120, in some embodiments. The magnetic core 142 is formed in the fourth passivation layer 140 and is surrounded by and insulated from the lower coil segment 132, the upper coil segment 162, and the vias 152. The magnetic core 142 has a trapezoidal cross-section. However, this is not a limitation of the present disclosure.

A lower surface A' of the magnetic core 142 overlies the third passivation layer 130. A fifth passivation layer 160 is formed over the fourth passivation layer 140 and the magnetic core 142. The upper coil segment 162 is formed in the fifth passivation layer 160. The vias 152 extend through the fourth passivation layer 140 to connect the upper coil segment 162 with the lower coil segment 132. Solder balls 172 may be formed on the fifth passivation layer 160 for external connections.

The embodiment in FIG. 1 shows five passivation layers, however, one of ordinary skill in the art will appreciate that more or less than five passivation layers may be formed without departing from the spirit and scope of the present disclosure. For example, there may be more passivation layers over the upper coil segment 162, and there could be more or less passivation layers under lower coil segment 132 than those illustrated in FIG. 1. In addition, other features such as contact pads, conductive traces, and external connectors may be formed in/on the semiconductor device 100, but are not shown in FIG. 1 for conciseness.

Figure 2A:
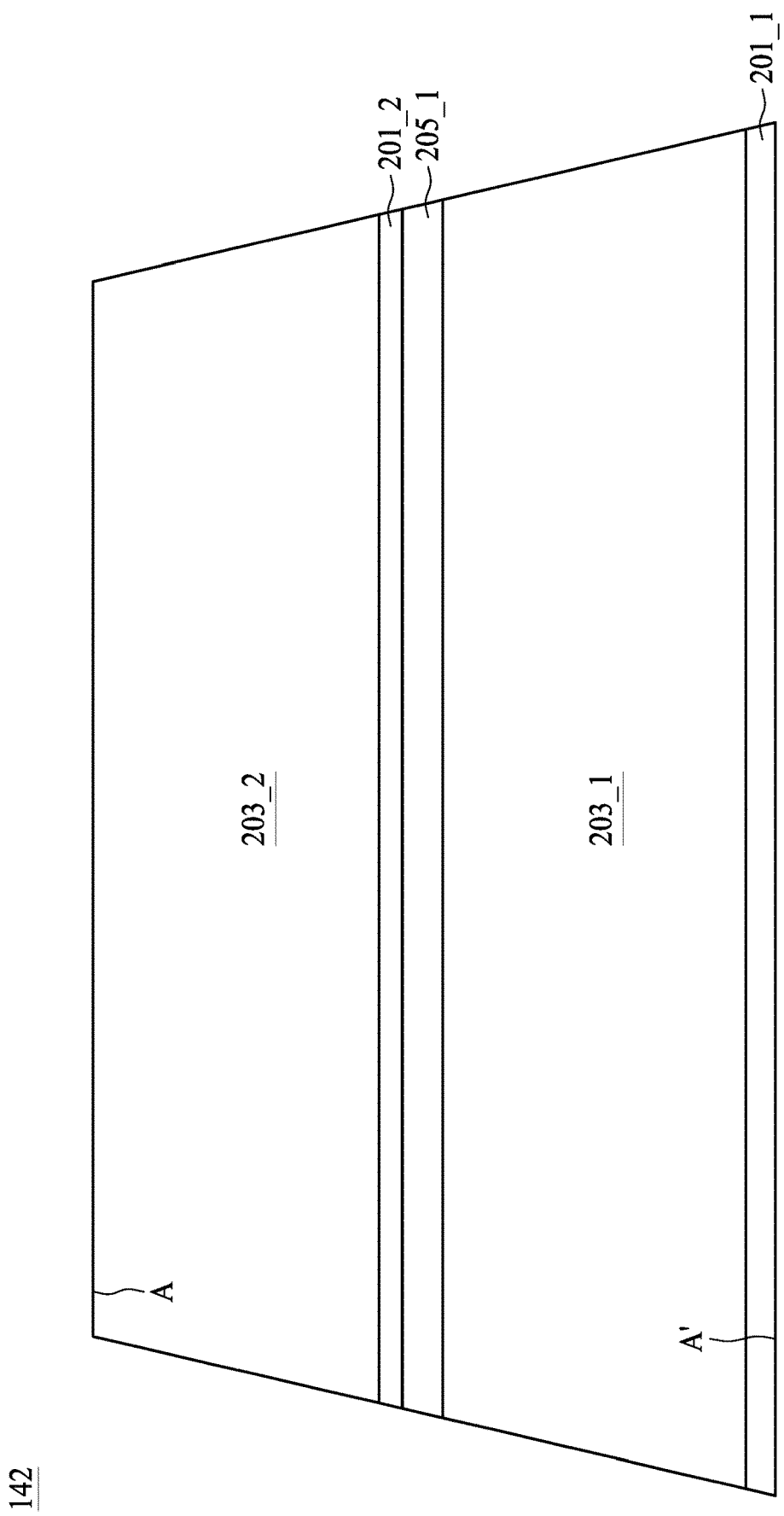
FIG. 2A to FIG. 2E illustrate cross-sectional views of the magnetic core in accordance with various embodiments of the present disclosure.

FIG. 2A to FIG. 2E illustrate cross-sectional views of the magnetic core 142 in accordance with various embodiments of the present disclosure. Throughout the various views and illustrative embodiments, like reference numbers are used to designate like elements. In FIG. 2A, a first type of the magnetic core 142 is disclosed. The magnetic core 142 is a two-layer magnetic core including magnetic material layers 203_1 and 203_2 which are separated by a high resistance isolation layer 205_1. By way of example, without intent of limiting, the magnetic layer may include $Co_xZr_yTa_z$ (CZT), where x, y, and z represents the atomic percentage of cobalt (Co), zirconium (Zr), and tantalum (Ta), respectively. In some embodiments, x is in a range from about 0.85 to about 0.95, y is in a range from about 0.025 to about 0.075, and z is in a range from about 0.025 to about 0.075. In accordance with some embodiments, the magnetic core 142 has a thickness of about 1 to 100 um, and the magnetic material layers 203_1 and 203_2 each has a thickness of about 0.5 to 50 um.

A purpose of the high resistance isolation layer 2051 is to mitigate electrical current circulation in the planar magnetic core perpendicularly to the upper surface A and the lower surface A'. Such perpendicular currents are known in the art as Eddy currents, and they would lead to energy losses for the integrated inductor 168. In the exemplary embodiment, Eddy currents in the integrated inductor 168 may become more significant due to a target operation frequency range greater than about 80 MHz. The high resistance isolation layer 205_1 having a resistivity greater than about 1.3 ohm-cm is capable of efficiently confining the induced eddy current to each individual layer. For example, the high resistance isolation layer 2051 may include $SiO_2$, $Si_3N_4$, AlN, $Al_2O_3$. In accordance with some embodiments, the high resistance isolation layer 205_1 has a thickness of about 20 to 1000 angstroms.

Metal layers 201_1 and 201_2 abutting bottoms of the magnetic material layers 203_1 and 203_2 respectively may act as a barrier to prevent oxygen from diffusing into the magnetic material layers 203_1 and 203_2, thus preventing magnetic property loss of the magnetic core 142. In the exemplary embodiment, the metal layers 201_1 and 2012 may include tantalum (Ta), titanium (Ti), or the like for its good temperature stability, which helps to prolong device lifetime. One skilled in the art will appreciate that other material having similar desirable properties as Ta may alternatively be used. In accordance with some embodiments, the Metal layers 201_1 and 201_2 each has a thickness of about 10 to 500 angstroms.

In some embodiments, the first type of the magnetic core 142 may include more than two magnetic material layers and each two adjacent magnetic material layers therein are separated by one high resistance isolation layer (the same or similar to the high resistance isolation layer 205_1) and one metal layer (the same or similar to the metal layer 201_1 and 201_2).

Figure 2B:
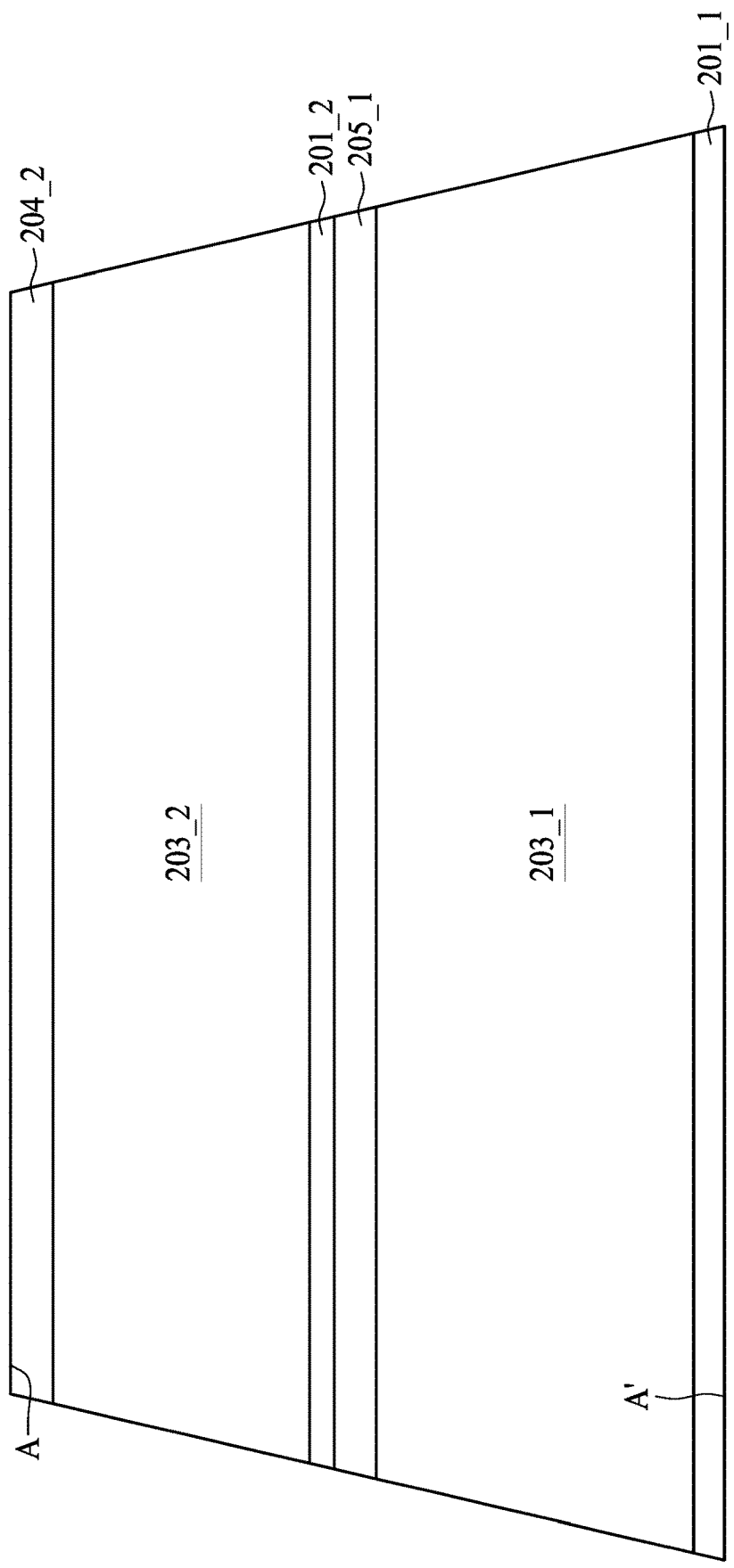

In FIG. 2B, a second type of the magnetic core 142 is disclosed. Comparing with the first type of FIG. 2A, the magnetic core 142 of the second type further includes a low resistance isolation layer 204_2 having a resistivity less than that of the high resistance isolation layer 2051. In other words, the low resistance isolation layer 204_2 has a resistivity less than about 1.3 ohm-cm. The low resistance isolation layer 204_2 is disposed abutting a top surface of the magnetic material layer 203_2 and includes a material different from the high resistance isolation layer 205_1. In the exemplary embodiment, the low resistance isolation layer 204_2 may include oxide of the magnetic material layer 203_2, i.e., oxide of CZT (OCZT). In accordance with some embodiments, the low resistance isolation layer 204_2 has a thickness substantially the same or similar to the high resistance isolation layer 2051. In some embodiments, the second type of the magnetic core 142 may include more than two magnetic material layers and each two adjacent magnetic material layers therein are separated by one high resistance isolation layer (the same or similar to the high resistance isolation layer 205_1) and one metal layer (the same or similar to the metal layer 201_1 and 201_2), and further with the low resistance isolation layer 204_2 at the top of the magnetic core 142.

Figure 2C:
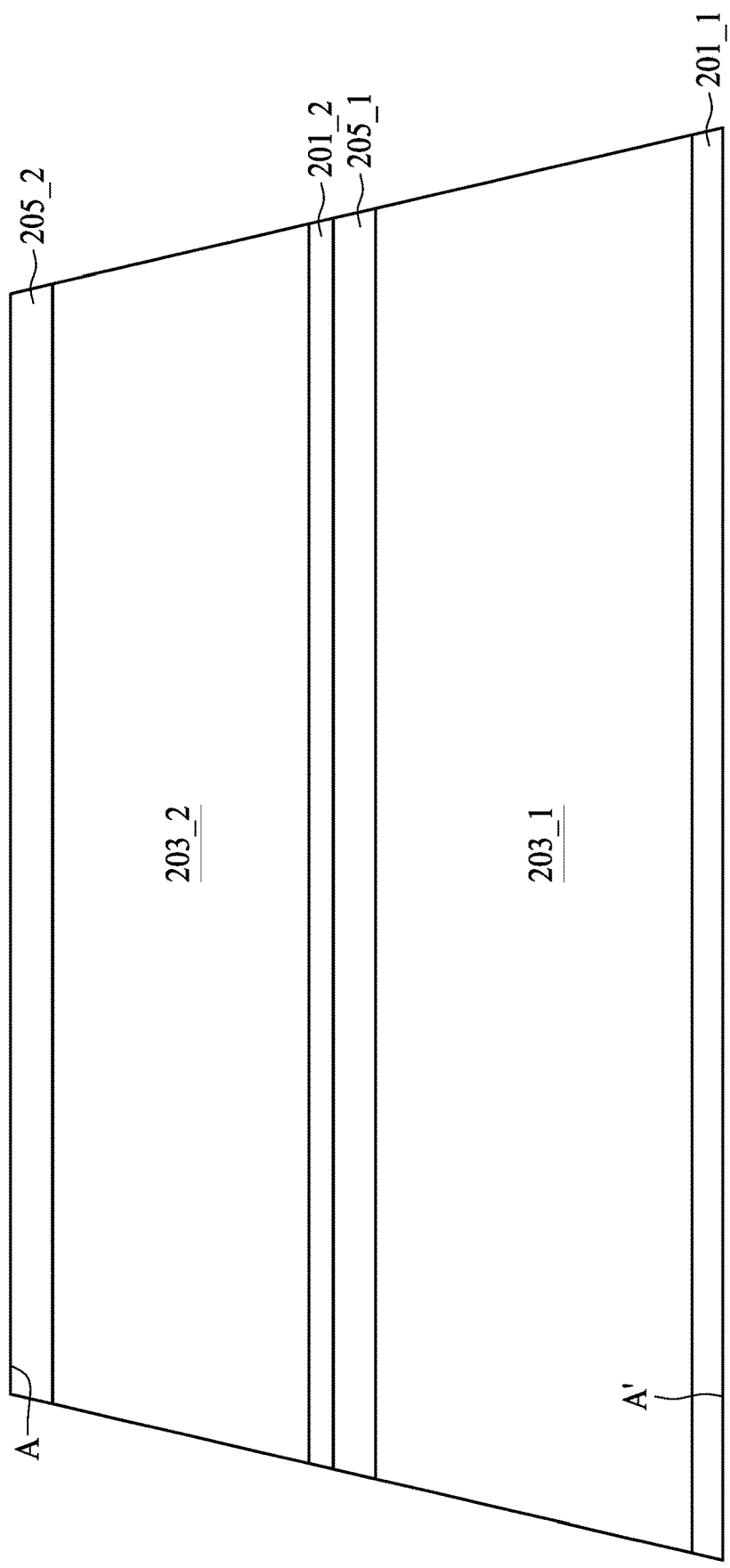

In FIG. 2C, a third type of the magnetic core 142 is disclosed. Comparing with the first type of FIG. 2A, the magnetic core 142 of the third type further includes one more high resistance isolation layer 205_2 having a resistivity the same with the high resistance isolation layer 205_1. In other words, the high resistance isolation layer 205_2 has a resistivity greater than about 1.3 ohm-cm. The high resistance isolation layer 205_2 is disposed abutting the top surface of the magnetic material layer 203_2 and includes a material substantially the same with the high resistance isolation layer 205_1. The high resistance isolation layer 205_2 may be comprised of a material the same or similar to the high resistance isolation layer 205_1. In accordance with some embodiments, the high resistance isolation layer 205_2 has a thickness substantially the same or similar to the high resistance isolation layer 2051. In some embodiments, the third type of the magnetic core 142 may include more than two magnetic material layers and each two adjacent magnetic material layers therein are separated by one high resistance isolation layer (the same or similar to the high resistance isolation layer 205_1) and one metal layer (the same or similar to the metal layer 201_1 and 201_2), and further with the high resistance isolation layer 205_2 at the top of the magnetic core 142.

Figure 2D:
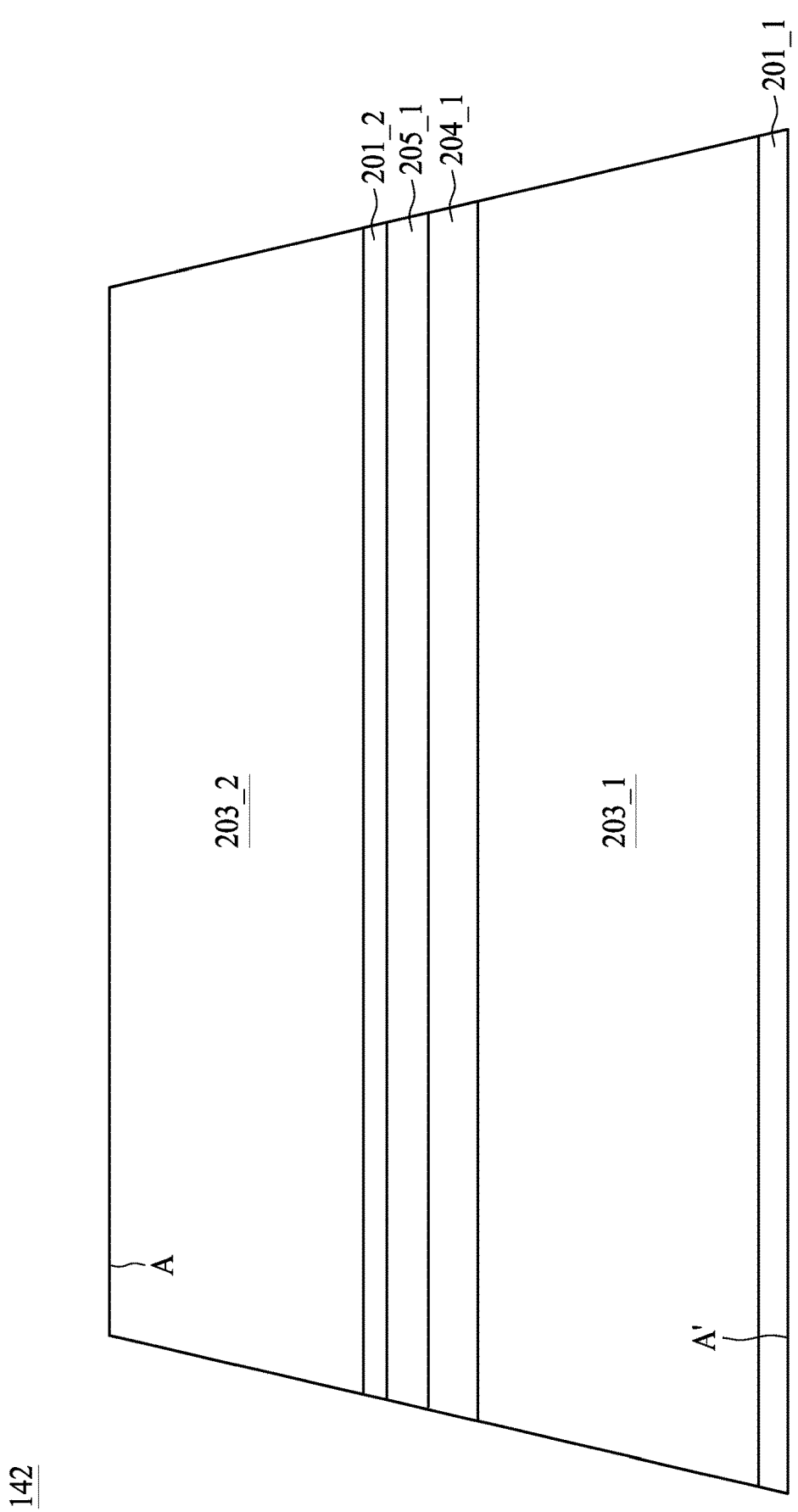

In FIG. 2D, a fourth type of the magnetic core 142 is disclosed. Comparing with the first type of FIG. 2A, the magnetic core 142 of the fourth type further includes a low resistance isolation layer 204_1 having a resistivity less than that of the high resistance isolation layer 2051. In other words, the low resistance isolation layer 204_1 has a resistivity less than about 1.3 ohm-cm. The low resistance isolation layer 204_1 may be comprised of a material the same or similar to the low resistance isolation layer 204_2 of the second type of the magnetic core 142 shown in FIG. 2B.

The low resistance isolation layer 2041 is disposed between a top surface of the magnetic material layer 203_1 and a bottom surface of the metal layer 201_2. Therefore the low resistance isolation layer 204_1 and the high resistance isolation layer 205_1 collectively form a composite isolation layer. A total thickness of the composite isolation layer including the low resistance isolation layer 204_1 and the high resistance isolation layer 205_1 may be greater than the high resistance isolation layer 205_1 of the first type of the magnetic core 142. However, this is not a limitation of the present disclosure. In some embodiments, a total thickness of the composite isolation layer including the low resistance isolation layer 204_1 and the high resistance isolation layer 205_1 may be substantially the same with the high resistance isolation layer 205_1 of the first type of the magnetic core 142.

Figure 2E:
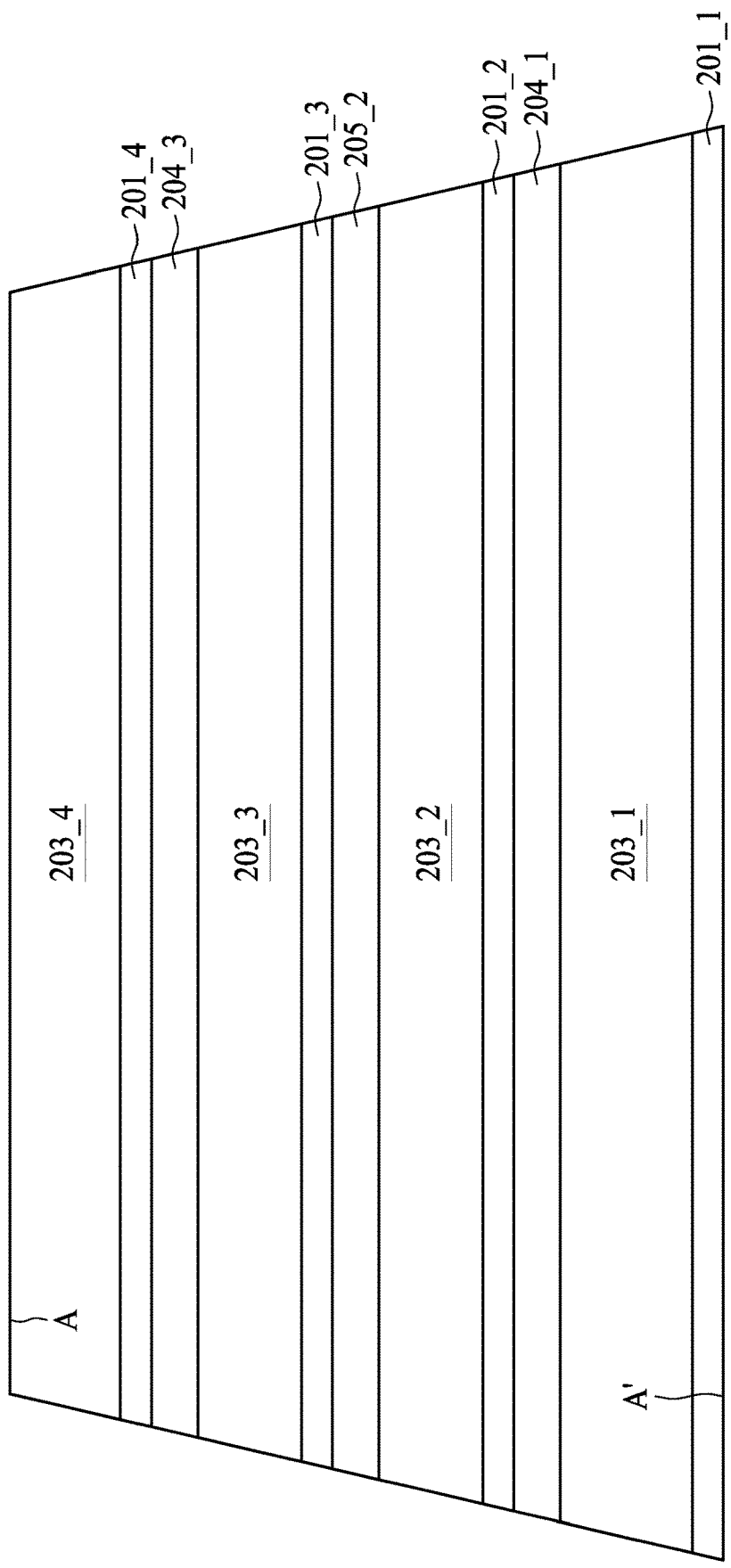

In FIG. 2E, a fifth type of the magnetic core 142 is disclosed. Comparing with the first type of FIG. 2A, the magnetic core 142 of the fifth type is a four-layer magnetic core, including four magnetic material layers 203_1, 203_2, 203_3 and 203_4 separated by isolation layers 204_1, 204_2 and 204_3 and metal layers 201_2, 201_3 and 201_4. The isolation layer 205_2 disposed around mid-height of the magnetic core 142 is high resistance, and except the isolation layer 205_2, other isolation layers 204_1 and 204_3 are low resistance isolation layers. The low resistance isolation layers 204_1 and 204_3 may be comprised of a material the same or similar to the low resistance isolation layer 204_2 of the second type of the magnetic core 142 shown in FIG. 2B and the low resistance isolation layer 204_1 of the fourth type of the magnetic core 142 shown in FIG. 2D. The high resistance isolation layer 205_2 may be comprised of a material the same or similar to the high resistance isolation layer 205_1 of the first type of the magnetic core 142 shown in FIG. 2A.

Figure 3:
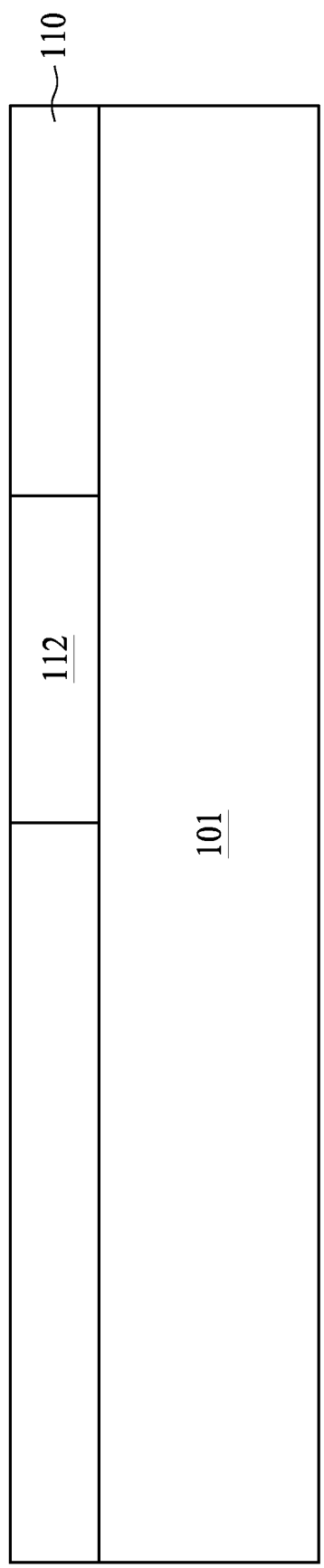
FIG. 3 to FIG. 13 illustrate cross-sectional views of the semiconductor device at various stages of fabrication according to embodiments of the present disclosure.

FIG. 3 to FIG. 13 illustrate cross-sectional views of the semiconductor device 100 at various stages of fabrication according to embodiments of the present disclosure. As illustrated in FIG. 3, the first passivation layer 110 may be formed on the semiconductor substrate 101. The first passivation layer 112 may be made of polymers, such as polybenzoxazole (PBO), polyimide, or benzocyclobutene, in some embodiments, or silicon dioxide, silicon nitride, silicon oxynitride, tantalum pentoxide, or aluminum oxide, in some other embodiments. The first passivation layer 112 may be formed through a process such as chemical vapor deposition (CVD), although any suitable process may be utilized. The first passivation layer 112 may have a thickness between about 0.5 μm and about 5 μm, however, other ranges of thickness are also possible, depending on the designs and requirements of the semiconductor device 100.

The post-passivation interconnect (PPI) 112 may be formed over the semiconductor substrate 101 and within the first passivation layer 110 to provide an electrical connection between the integrated inductor 168 and other circuits of the semiconductor device 100, in some embodiments. For example, the PPI 112 may be connected to metal layers (not shown) in the substrate 101. The PPI 112 may be comprised of copper, but other materials, such as aluminum, may alternatively be used. An opening through the first passivation layer 112 may be made in the desired location of PPI 112 through a suitable process, such as a suitable photolithographic masking and etching. For example, a photoresist (not shown) may be formed on the first passivation layer 110 and may then be patterned in order to provide an opening in the first passivation layer 110. The patterning may be performed by exposing the photoresist to a radiation such as light in order to activate photoactive chemicals that may make up one component of the photoresist. A positive developer or a negative developer may then be used to remove either the exposed or unexposed photoresist depending on whether positive or negative photoresist is used.

Once the photoresist has been developed and patterned, PPI 112 may be constructed by using the photoresist as a mask to form the opening into or through the first passivation layer 110 using, e.g., an etching process. The conductive material may then be formed into the opening into or through the first passivation layer 110, e.g., by first applying a seed layer (not shown) into and along the sidewalls of the opening. The seed layer may then be utilized in an electroplating process in order to plate the conductive material into the opening into or through the first passivation layer 110, thereby forming the first interconnect 112. However, while the material and methods discussed are suitable to form the conductive material, these materials are merely exemplary. Any other suitable materials, such as tungsten, and any other suitable processes of formation, such as CVD or physical vapor deposition (PVD), may alternatively be used to form the PPI 112.

Figure 4:
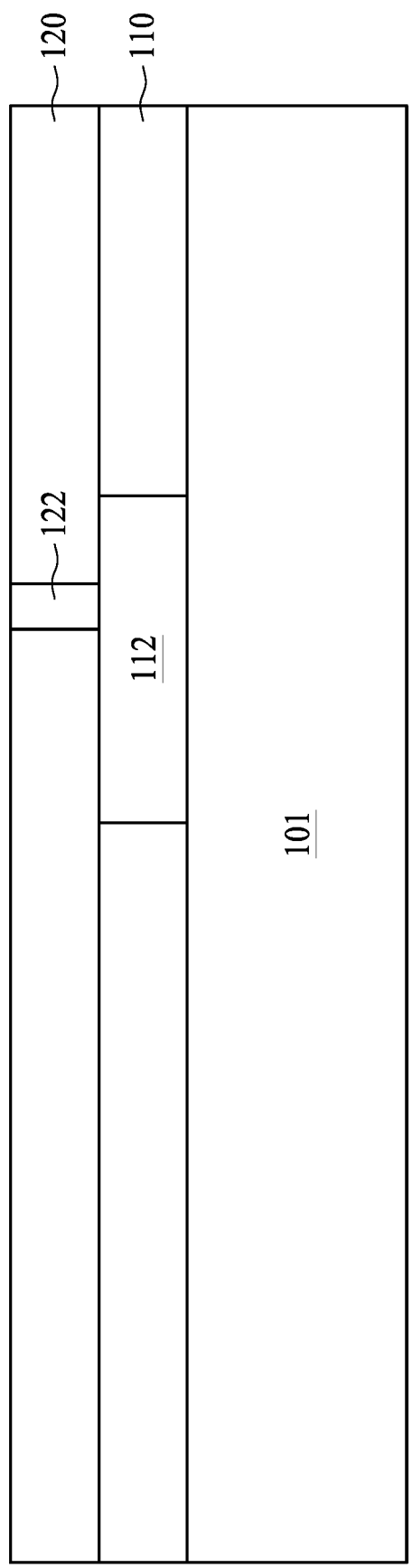

A second passivation layer 120 may be formed over the first passivation layer 110, as illustrated in FIG. 4. In some embodiments, the second passivation layer 120 may be comprised of the same material as the first passivation layer 110. Alternatively, the second passivation layer 120 may include other suitable dielectric materials different from the materials in the first passivation layer 110. Deposition process such as CVD, PVD, combinations thereof, or any other suitable processes of formation, can be used to form the second passivation layer 120. The second passivation layer 120 may have a thickness between about 0.5 μm and about 5 μm, however, other ranges of thickness are also possible, depending on the designs and requirements of the semiconductor device 100.

Vias 122 may be formed in the second passivation layer 120 to provide a conductive path between the PPI 112 in the first passivation layer 110 and the integrated inductor 168 formed in subsequent processing. The vias 122 may include copper, but other materials, such as aluminum or tungsten, may alternatively be used. The vias 122 may be formed, e.g., by forming openings for the vias 122 through the second passivation layer 120 using, e.g., a suitable photolithographic mask and etching process. After the openings for vias 122 have been formed, vias 112 may be formed using a seed layer (not shown) and a plating process, such as electrochemical plating, although other processes of formation, such as sputtering, evaporation, or plasma-enhanced CVD (PECVD) process, may alternatively be used depending upon the desired materials. Once the openings for vias 112 have been filled with conductive material, any excess conductive material outside of the openings for the vias 112 may be removed, and the vias 112 and the second passivation layer 120 may be planarized using, for example, a chemical mechanical polishing (CMP) process.

Figure 5:
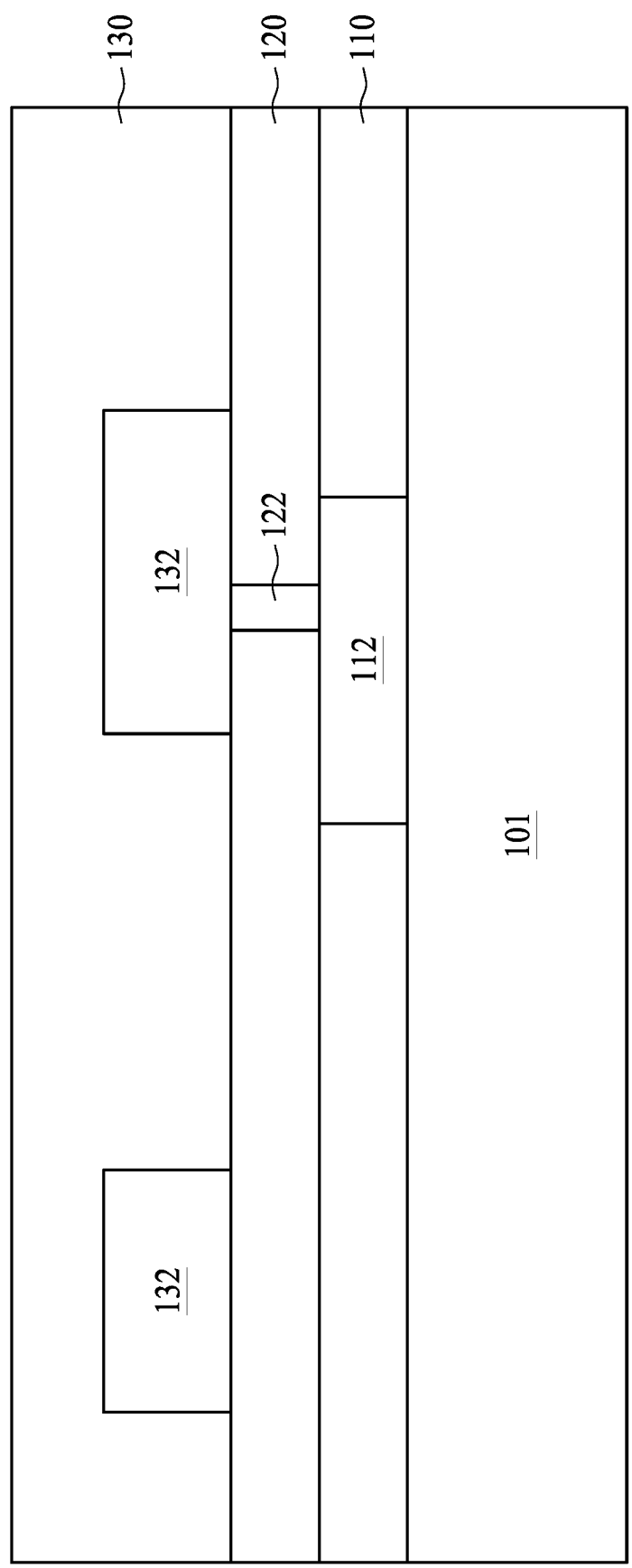

As illustrated in FIG. 5, the lower coil segment 132 is formed over the second passivation layer 120. In accordance with some embodiments, the lower coil segment 132 may include copper. In one embodiment, the lower coil segment 132 has a thickness in a range between about 5 um and about 20 um. The above thickness range is merely an example, the dimensions of the integrated inductor 168 (e.g., the lower coil segment 132, the upper coil segment 162, the vias 152 and the magnetic core 142) are determined by various factors such as the functional requirements for the integrated inductor 168 and process technologies, thus other dimensions for the integrated inductor 168 are possible and are fully intended to be included within the scope of the current disclosure.

Next, a third passivation layer 130 may be formed over the second passivation layer 120 and the lower coil segment 132. The third passivation layer 130 may be comprised of the same material as the first passivation layer 110 and may be formed by CVD, PVD, or any other suitable processes of formation, in some embodiments. Alternatively, the third passivation layer 130 may include other suitable materials different from the dielectric materials in the first passivation layer 110. The thickness of the third passivation layer 130 may be larger than the thickness of the lower coil segment 132 so that the lower coil segment 132 is encapsulated in the third passivation layer 130. The third passivation layer 112 may have a thickness between about 5 μm and about 20 μm, however, other ranges of thickness are also possible, depending on the designs and requirements of the semiconductor device 100.

Figure 6:
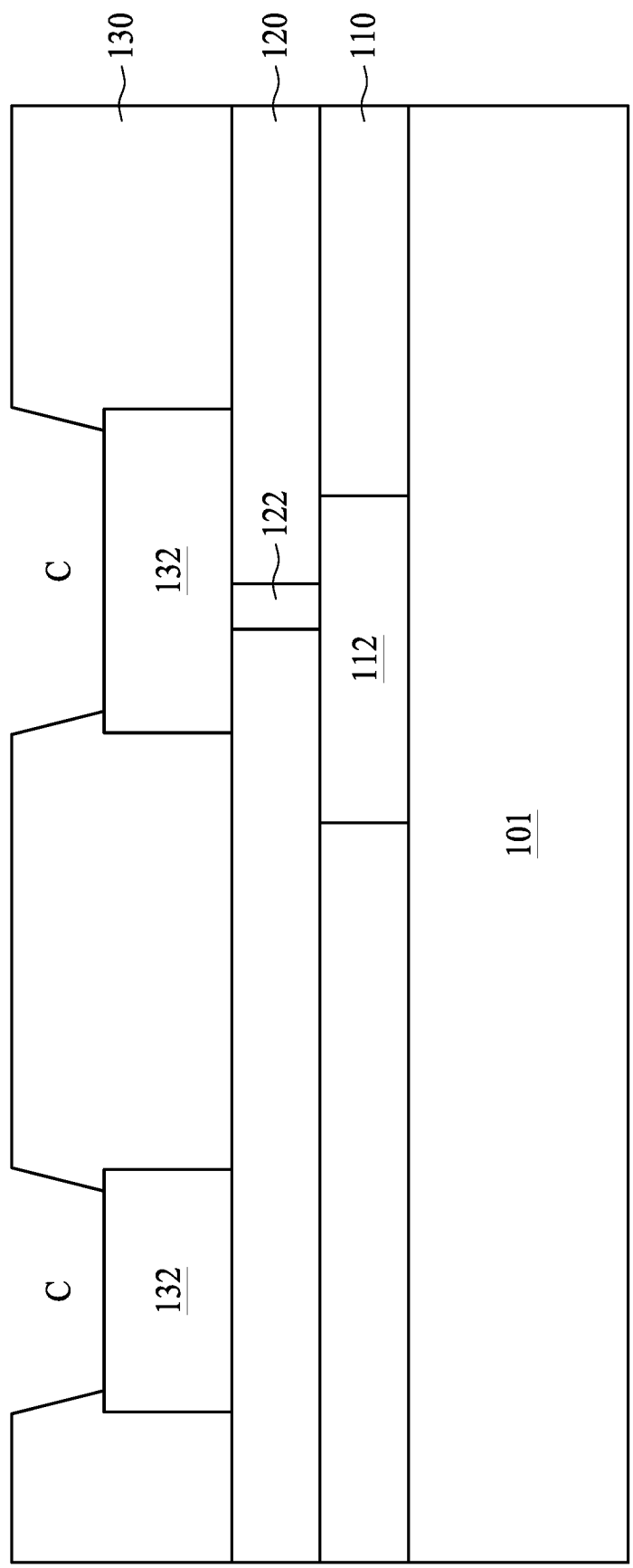

Referring next to FIG. 6, an etching process is performed to remove an upper portion of the third passivation layer 130 to expose an upper surface of the lower coil segment 132, in some embodiments. As a result of the etching process, openings C extend into the third passivation layer 130. The etching process is controlled to stop when reaching the lower coil segment 132. Sidewalls of the openings C may be sloped. However, in some embodiments of the present disclosure, the openings C may have straight sidewalls.

Figure 7:
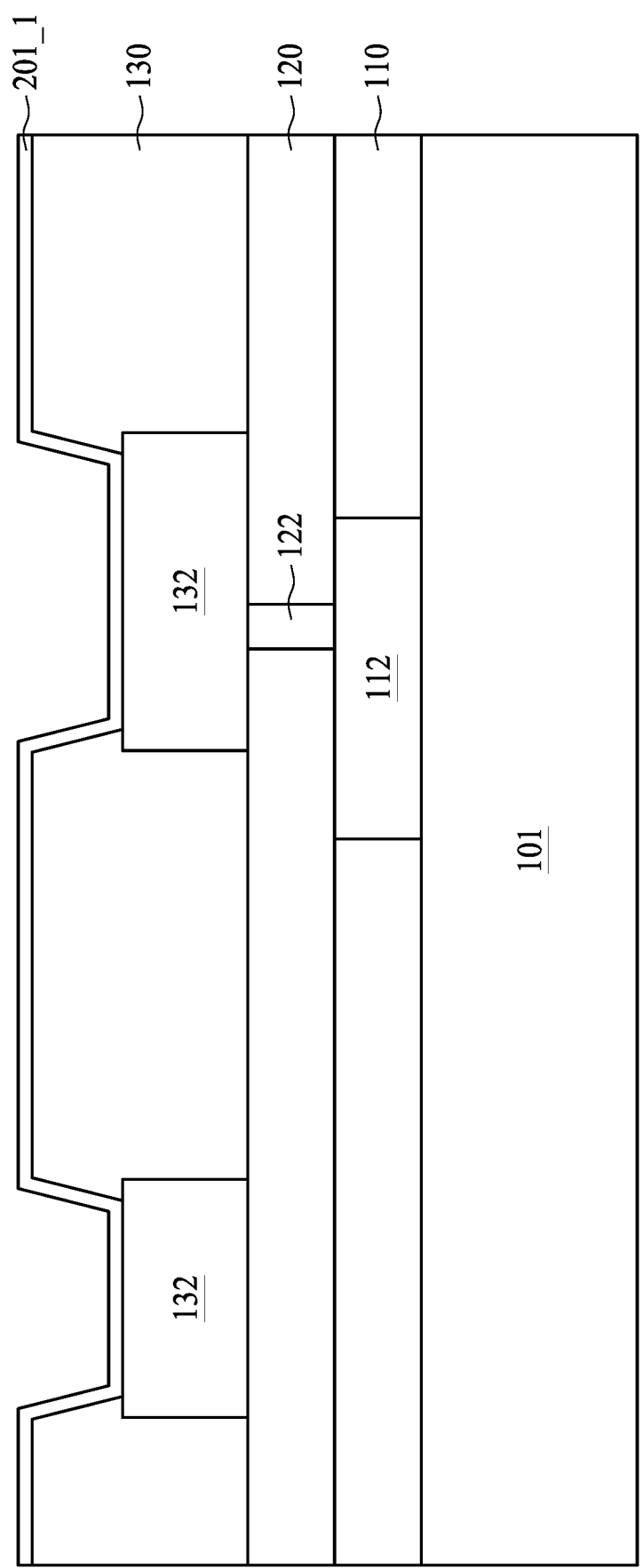
Figure 8:
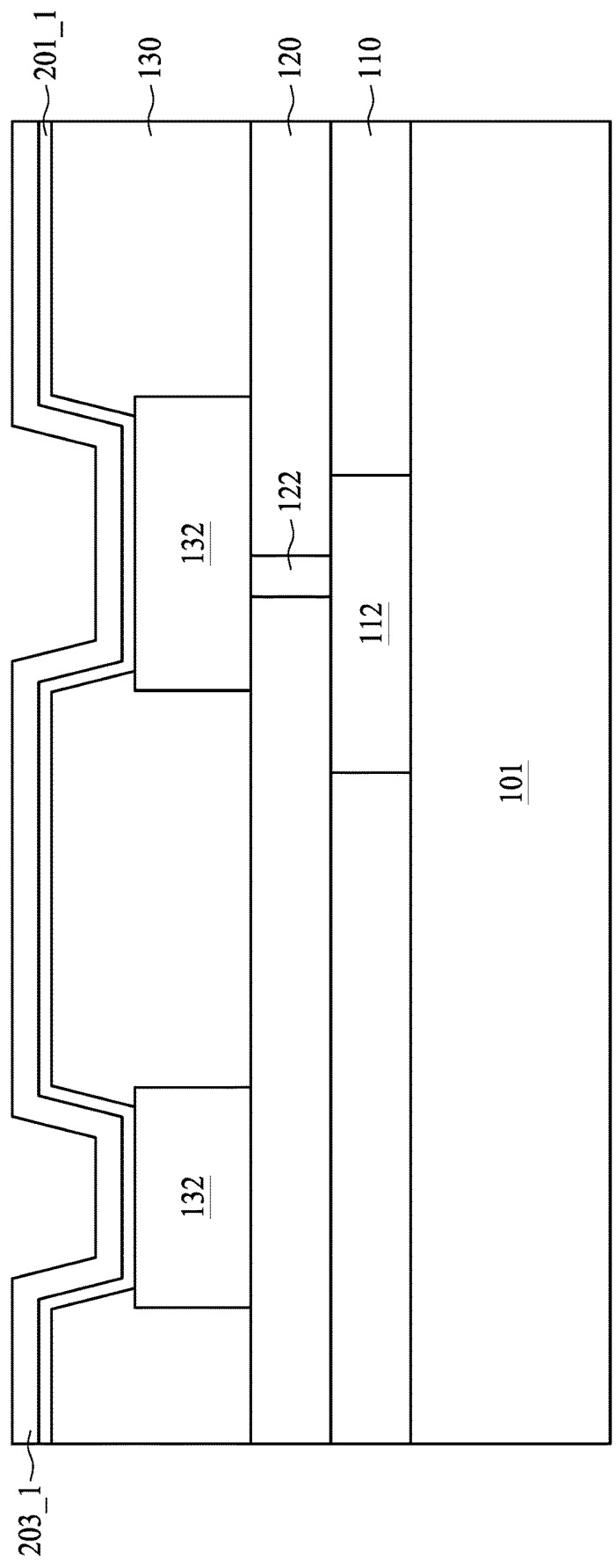

Next, FIG. 7 to FIG. 11 illustrate the formation of the first type of the magnetic core 142 according to an embodiment of the present disclosure. In FIG. 7, the metal layer 201_1 is blanket deposited over the third passivation layer 130 and the lower coil segment 132. The metal layer 201_1 may be made of one or more suitable materials such as tantalum (Ta), titanium (Ti), or the like. A thickness of the metal layer 201_1 may be about 50 angstroms to about 300 angstroms, however, other ranges of thickness are also possible, depending on the designs and requirements of the semiconductor device 100. In FIG. 8, the magnetic material layer 203_1 is deposited over the metal layer 201_1 by a PVD, CVD, PE-CVD, combinations thereof, or any other suitable deposition process. In accordance with an embodiment, without intent of limiting, the magnetic material layer 203_1 is conformally deposited over the metal layer 201_1. In accordance with some embodiments, the magnetic material layer 203_1 includes $Co_xZr_yTa_z$ (CZT), where x, y, and z represents the atomic percentage of cobalt (Co), zirconium (Zr), and tantalum (Ta), respectively. In some embodiments, x is in a range from about 0.85 to about 0.95, y is in a range from about 0.025 to about 0.075, and z is in a range from about 0.025 to about 0.075. In accordance with some embodiments, the magnetic material layer 203_1 has a thickness of about 5 um.

Figure 9:
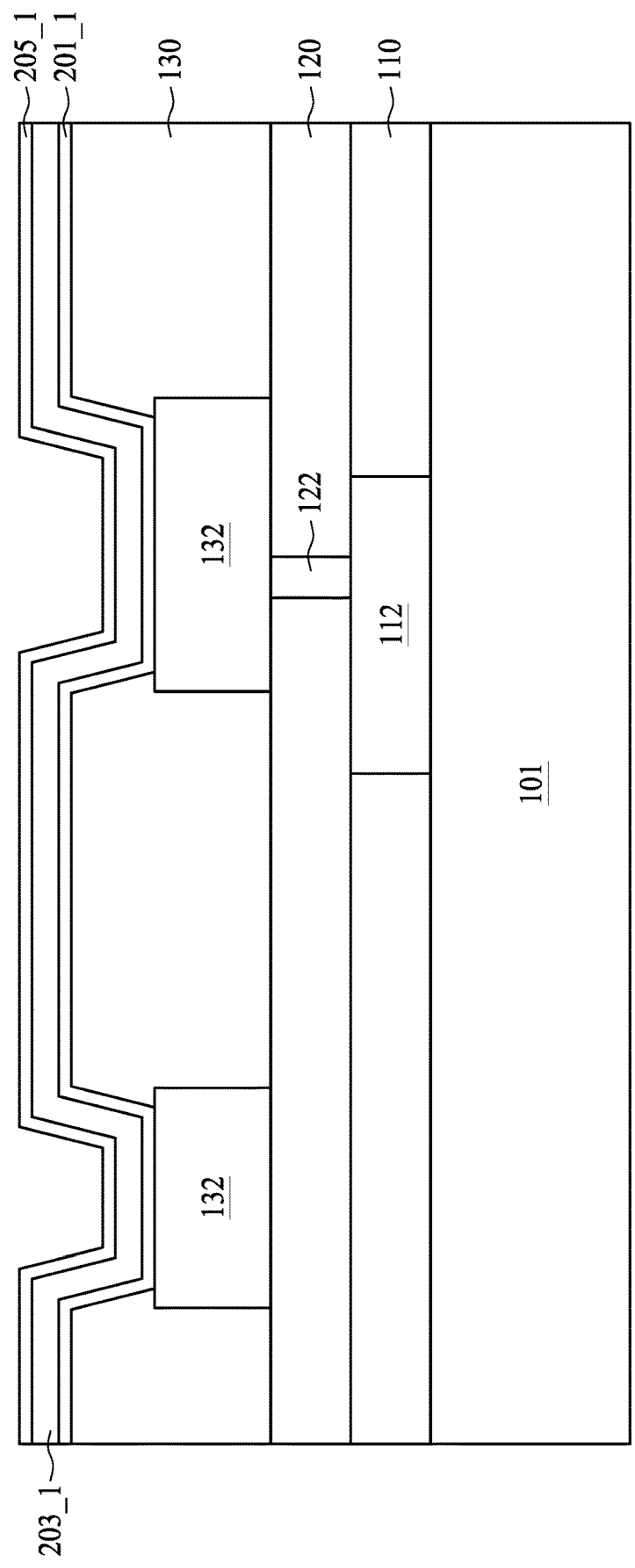
Figure 10:
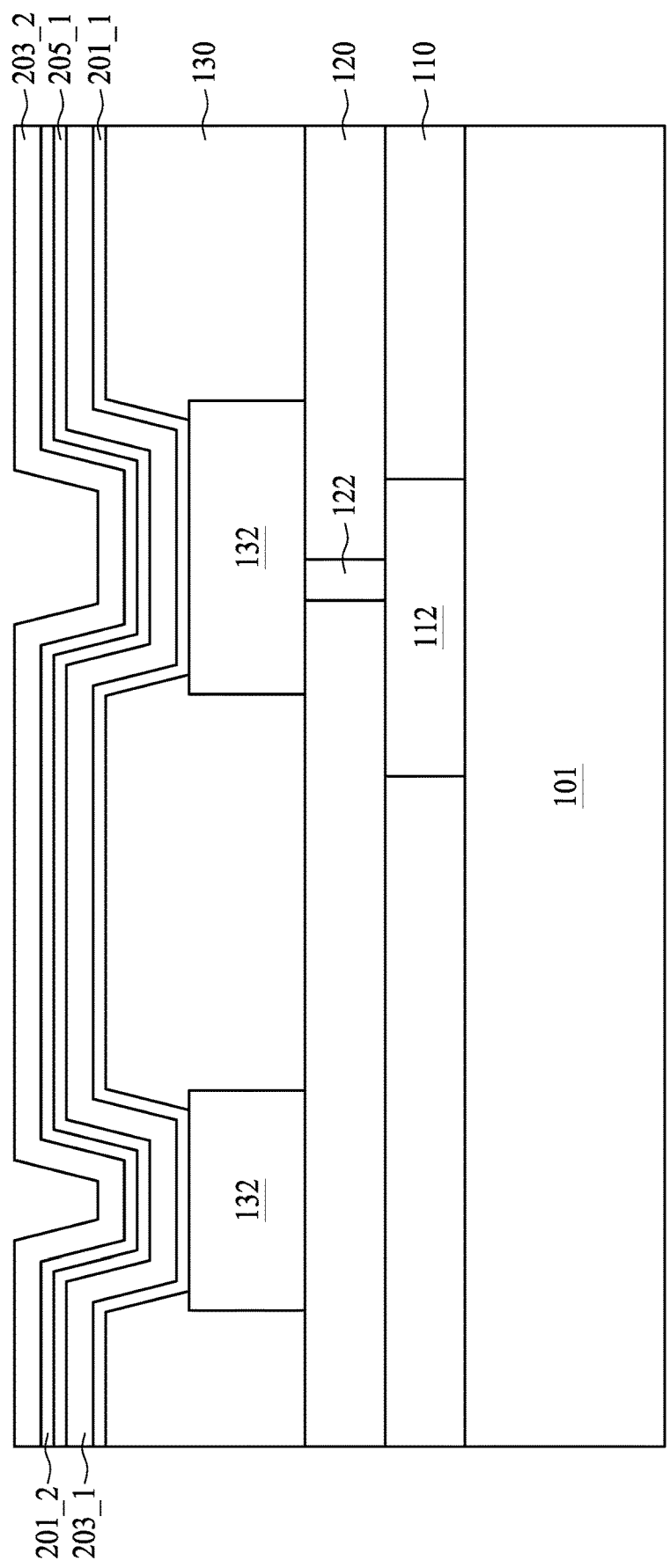

In FIG. 9, the high resistance isolation layer 205_1 is deposited over the magnetic material layer 203_1 through any suitable deposition process known in the art. In accordance with some embodiments, the high resistance isolation layer 205_1 includes $SiO_2$, $Si_3N_4$, AlN, $Al_2O_3$. In accordance with some embodiments, the high resistance isolation layer 205_1 has a thickness of about 20 to 1000 angstroms. Next, the metal layer 201_2 and the magnetic material layer 203_2 are sequentially deposited in a way the same or similar to the deposition of the the metal layer 201_1 and the magnetic material layer 203_1 as shown in FIG. 10.

Figure 11:
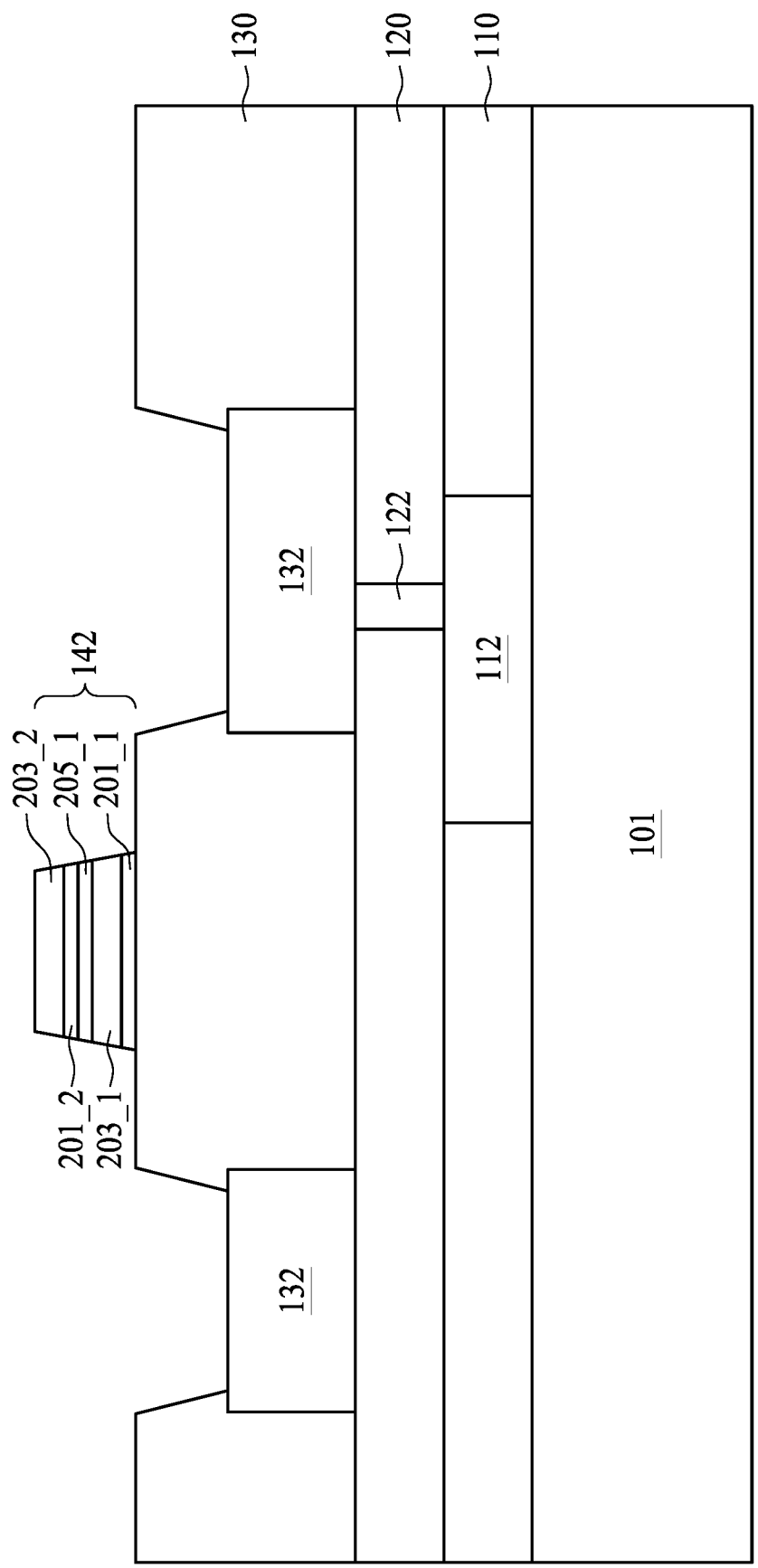
Figure 12:
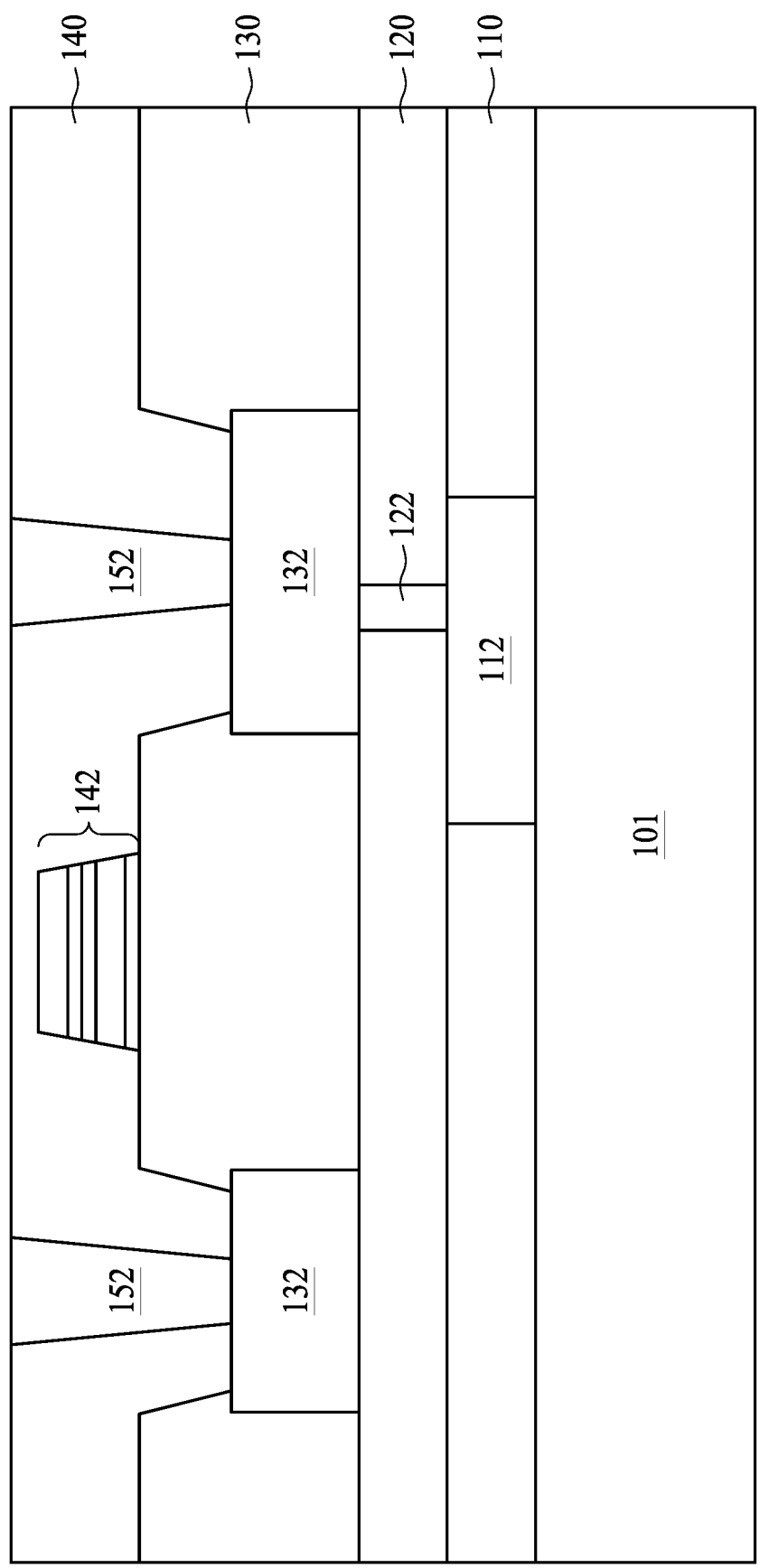

In FIG. 11, a portion of the stacked layers including 201_1, 203_1, 205_1, 201_2 and 2032 may be removed through a wet etch. The remaining stacked layers forms the magnetic core 142. A wet etching agent for the wet etch may include a HF solution, a $HNO_3$ solution, a $CH_3COOH$ solution, combinations thereof, or other suitable solution. Next, as illustrated in FIG. 12, a fourth passivation layer 140 is formed over the magnetic core 142 and the third passivation layer 130. The fourth passivation layer 140 may be comprised of the same material as the first passivation layer 110 and may be formed by CVD, PVD, or any other suitable processes of formation, in some embodiments. Alternatively, the fourth passivation layer 140 may include other suitable materials different from the dielectric materials in the first passivation layer 110. The third passivation layer 112 may have a thickness between about 5 μm and about 10 μm, however, other ranges of thickness are also possible, depending on the designs and requirements of the semiconductor device 100.

After the fourth passivation layer 140 is formed, the vias 152 may be formed, e.g., by forming openings for the vias 152 through the fourth passivation layer 140 using, e.g., a lithography and etching process. The vias 152 may be formed adjacent to opposing sidewalls of the magnetic core 142. After the openings for vias 152 have been formed, the vias 152 may be formed using a seed layer (not shown) and a plating process, such as electrochemical plating, although other processes of formation, such as sputtering, evaporation, or PECVD process, may alternatively be used depending upon the desired materials. Once the openings for vias 152 have been filled with conductive material such as copper, any excess conductive material outside of the openings for vias 152 may be removed, and the vias 152 and the fourth passivation layer 140 may be planarized using, for example, a CMP process.

Figure 13:
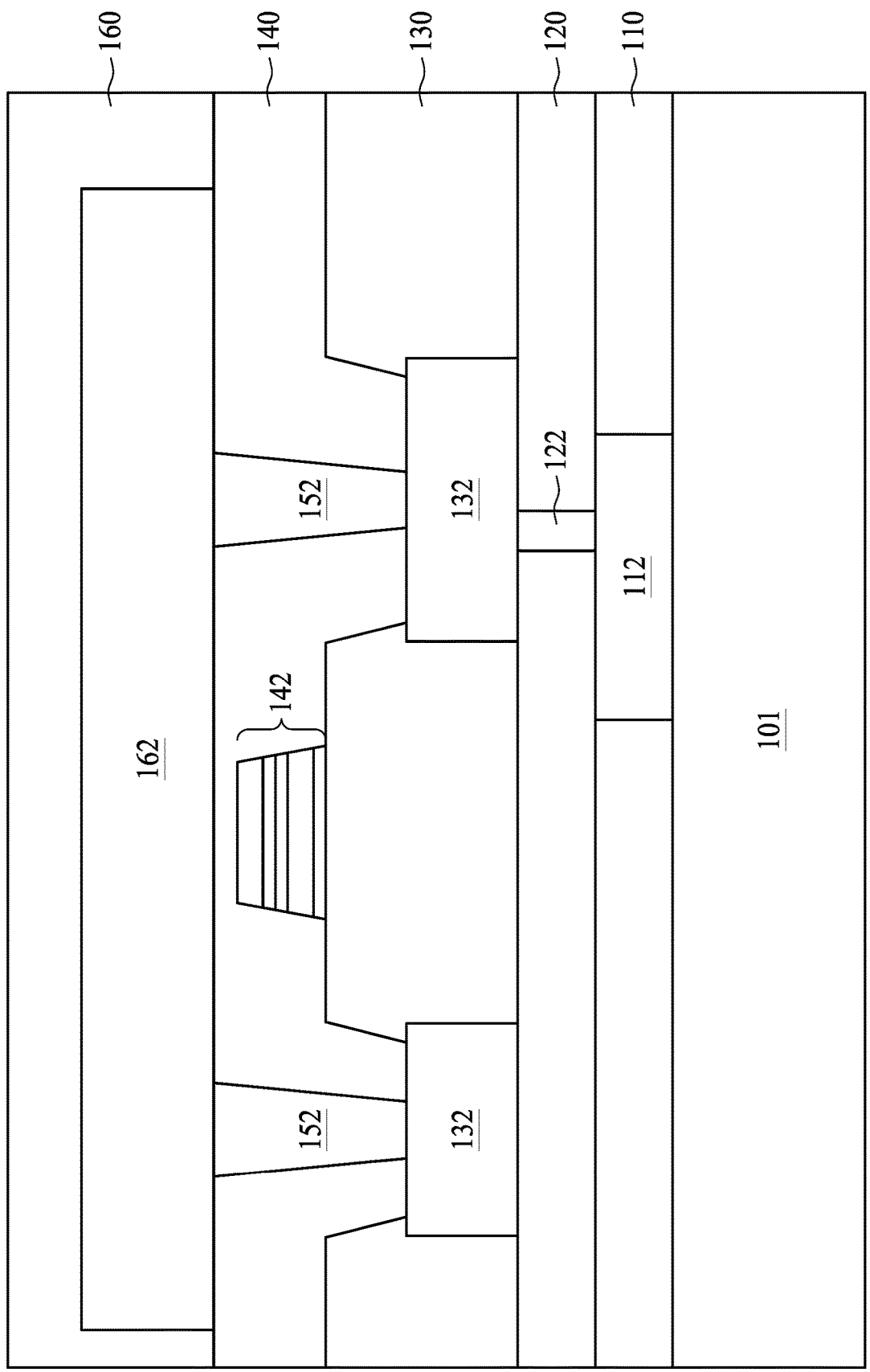

Next, referring to FIG. 13, the upper coil segment 162 is formed over the fourth passivation layer 140. In some embodiments, the upper coil segment 162 is made of copper. In one embodiment, the upper coil segment 162 has a thickness in a range between about 10 um and about 15 um, such as about 12 um. Other dimensions are possible and may depend on, for example, the functional requirements for the integrated inductors 168 and process technologies.

Next, a fifth passivation layer 160 may be formed over the fourth passivation layer 140 and the upper coil segment 162. The fifth passivation layer 160 may be comprised of the same material as the first passivation layer 110 and may be formed by CVD, PVD, or any other suitable processes of formation, in some embodiments. Alternatively, the fifth passivation layer 160 may include other suitable materials different from the dielectric materials in the first passivation layer 110. The thickness of the fifth passivation layer 160 may be larger than the thickness of the upper coil segment 162 so that upper coil segment 162 is encapsulated in the sixth passivation layer 160 and protected from outside environment. In some embodiments, one or more passivation layers may be formed over the fifth passivation layer 160. Referring back to FIG. 1, conductive terminals such as solder balls 172 can be formed over the fifth passivation layer 160 in order to make external connection to a voltage source.

Figure 14:
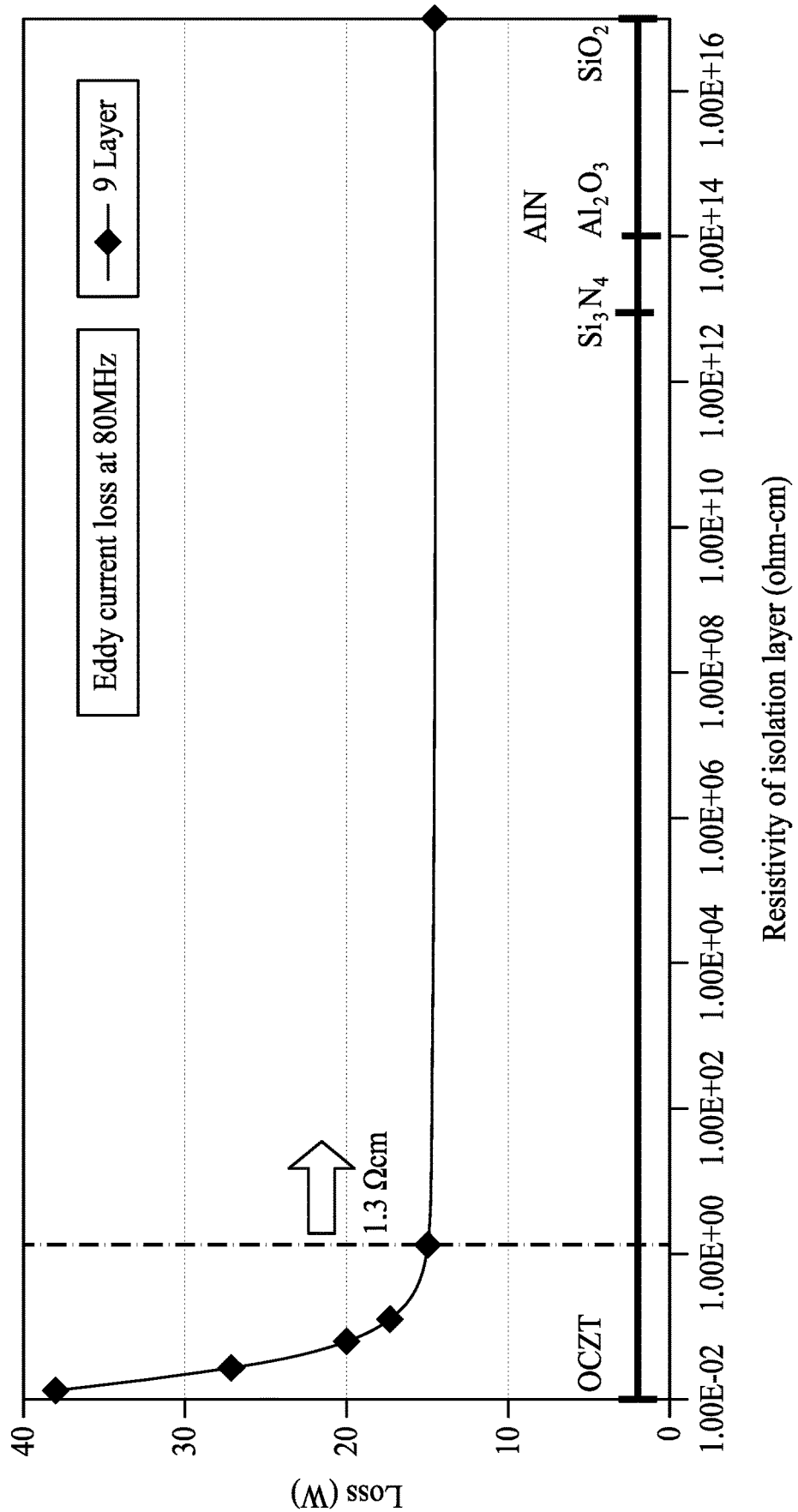
FIG. 14 is a diagram illustrating Eddy currents energy losses of an integrated inductor with respect to different materials of isolation isolation layer according to various embodiments of the present disclosure.

FIG. 14 is a diagram illustrating Eddy currents energy losses of an integrated inductor with respect to different materials of isolation isolation layer according to various embodiments of the present disclosure. The integrated inductor in the embodiment has a nine-layer magnetic core and operates at 80 MHz. As can be seen from FIG. 14, the Eddy currents energy losses reduce when the resistance of the isolation layer increases. The Eddy currents energy losses gradually saturates when the resistance of the isolation layer approaches up to about 1.3 ohm-cm. As such, $SiO_2$, $Si_3N_4$, AlN, $Al_2O_3$ are more efficiently to mitigate the Eddy currents energy losses compared to OCZT.

Some embodiments of the present disclosure provide a semiconductor structure. The semiconductor structure includes: a substrate; a first passivation layer over the substrate; a second passivation layer over the first passivation layer; and a magnetic core in the second passivation layer; wherein the magnetic core includes a first magnetic material layer and a second magnetic material layer over the first magnetic material layer, the first magnetic material layer and the second magnetic material layer are separated by a high resistance isolation layer, and the high resistance isolation layer has a resistivity greater than about 1.3 ohm-cm.

Some embodiments of the present disclosure provide a semiconductor structure. The semiconductor structure includes: a first passivation layer; a second passivation layer over the first passivation layer; a third passivation layer over the second passivation; a lower coil segment in the first passivation layer; an upper coil segment in the third passivation layer; and a magnetic core in the second passivation layer and insulated from the lower coil segment and the upper coil segment; wherein the magnetic core includes a first magnetic material layer and a second magnetic material layer over the first magnetic material layer, the first magnetic material layer and the second magnetic material layer are separated by a composite isolation layer including a high resistance isolation layer and a low resistance isolation layer, and the high resistance isolation layer has a resistivity greater than that of the low resistance isolation layer.

Some embodiments of the present disclosure provide a semiconductor structure. The semiconductor structure includes: a first passivation layer; a second passivation layer over the first passivation layer; a third passivation layer over the second passivation; a lower coil segment in the first passivation layer; an upper coil segment in the third passivation layer; and a magnetic core in the second passivation layer and insulated from the lower coil segment and the upper coil segment; wherein the magnetic core from bottom to top includes a first magnetic material layer, a second magnetic material layer, a third magnetic material layer and a fourth magnetic material layer, the first magnetic material layer and the second magnetic material layer are separated by a first low resistance isolation layer, the second magnetic material layer and the third magnetic material layer are separated by a high resistance isolation layer, the third magnetic material layer and the fourth magnetic material layer are separated by a second low resistance isolation layer, and the high resistance isolation layer has a resistivity greater than that of the low resistance isolation layer.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a semiconductor structure, comprising:
    depositing a first magnetic material layer over a substrate;
    depositing a high resistance isolation layer having a resistivity greater than about 1.3 ohm-cm over the first magnetic material layer;
    depositing a metal layer over the high resistance isolation layer before depositing a second magnetic material layer;
    depositing the second magnetic material layer over the high resistance isolation layer; and
    removing a portion of the first magnetic material layer, the high resistance isolation layer and second magnetic material layer to form a magnetic core.

2. The method of claim 1, wherein the high resistance isolation layer includes $Si_3N_4$.

3. The method of claim 1, wherein the high resistance isolation layer includes AlN.

4. The method of claim 1, wherein the high resistance isolation layer includes $Al_2O_3$.

5. The method of claim 1, wherein the metal layer includes tantalum (Ta).

6. The method of claim 1, further comprising:
    forming a low resistance isolation layer having a resistivity less than about 1.3 ohm-cm on a top surface of the second magnetic material layer.

7. The method of claim 1, further comprising:
    depositing another high resistance isolation layer having a resistivity greater than about 1.3 ohm-cm on a top surface of the second magnetic material layer.

8. A method of forming a semiconductor structure, comprising:
    forming a lower coil segment over a semiconductor substrate;
    depositing a first magnetic material layer over the lower coil segment;
    depositing a high resistance isolation layer over the first magnetic material layer;
    depositing a metal layer over the high resistance isolation layer before depositing a second magnetic material layer;
    depositing the second magnetic material layer over the high resistance isolation layer;
    removing a portion of the first magnetic material layer, the high resistance isolation layer and the second magnetic material layer to form a magnetic core; and
    forming an upper coil segment over the magnetic core.

9. The method of claim 8, wherein the high resistance isolation layer has a resistivity greater than about 1.3 ohm-cm.

10. The method of claim 9, wherein the high resistance isolation layer includes $Si_3N_4$.

11. The method of claim 8, further comprising:
    depositing a metal layer over the lower coil segment before depositing the first magnetic material layer.

12. The method of claim 8, wherein the metal layer includes tantalum (Ta).

13. A method of forming a semiconductor structure, comprising:
    forming a lower coil segment over a substrate;
    depositing a first magnetic material layer over the lower coil segment;
    depositing a first low resistance isolation layer over the first magnetic material layer;
    depositing a second magnetic material layer over a high resistance isolation layer;
    depositing the high resistance isolation layer over the second magnetic material layer;
    depositing a third magnetic material layer over the high resistance isolation layer;
    depositing a second low resistance isolation layer over the third magnetic material layer;
    depositing a fourth magnetic material layer over the second low resistance isolation layer;
    removing a portion of the first magnetic material layer, the first low resistance isolation layer, the second magnetic material layer, the high resistance isolation layer, the third magnetic material layer, the second low resistance isolation layer and the fourth magnetic material layer to form a magnetic core; and
    forming an upper coil segment over the magnetic core;
    wherein the high resistance isolation layer has a resistivity greater than that of the first low resistance isolation layer and the second low resistance isolation layer.

14. The method of claim 13, wherein the high resistance isolation layer has a resistivity greater than about 1.3 ohm-cm.

15. The method of claim 13, wherein the first low resistance isolation layer and the second low resistance isolation layer have a resistivity less than about 1.3 ohm-cm.

16. The method of claim 13, wherein the high resistance isolation layer includes $Al_2O_3$.

17. The method of claim 13, wherein high resistance isolation layer includes $Si_3N_4$.

18. The method of claim 13, wherein high resistance isolation layer includes AlN.

19. The method of claim 13, wherein the first low resistance isolation layer includes oxide of $Co_xZr_yTa_z$ (CZT), wherein x, y, and z represent the atomic percentages of cobalt (Co), zirconium (Zr), and tantalum (Ta) respectively, wherein x is in a range from about 0.85 to about 0.95, y is in a range from about 0.025 to about 0.075, and z is in a range from about 0.025 to about 0.075.

20. The method of claim 13, wherein the second low resistance isolation layer includes oxide of $Co_xZr_yTa_z$ (CZT), wherein x, y, and z represent the atomic percentages of cobalt (Co), zirconium (Zr), and tantalum (Ta) respectively, wherein x is in a range from about 0.85 to about 0.95, y is in a range from about 0.025 to about 0.075, and z is in a range from about 0.025 to about 0.075.

* * * * *